United States Patent [19]

Hernandez

[11] Patent Number: 5,051,542
[45] Date of Patent: * Sep. 24, 1991

[54] LOW IMPEDANCE BUS BAR

[75] Inventor: Jorge M. Hernandez, Mesa, Ariz.

[73] Assignee: Rogers Corporation, Rogers, Conn.

[ * ] Notice: The portion of the term of this patent subsequent to Mar. 13, 2007 has been disclaimed.

[21] Appl. No.: 291,514

[22] Filed: Dec. 29, 1988

Related U.S. Application Data

[63] Continuation-in-part of Ser. No. 226,619, Aug. 1, 1988.

[51] Int. Cl.$^5$ .............................................. H01B 7/00
[52] U.S. Cl. .................................. 174/72 B; 361/398; 361/407
[58] Field of Search ...................... 361/397, 398, 407; 428/901, 457, 209; 174/254, 72 B

[56] References Cited

U.S. PATENT DOCUMENTS

| | | | |
|---|---|---|---|
| 3,778,735 | 12/1973 | Steenmetser | 174/72 B X |
| 4,401,843 | 8/1983 | Harper et al. | 174/72 B |
| 4,440,972 | 4/1984 | Taylor | 174/72 B |
| 4,908,258 | 3/1990 | Hernandez | 361/398 X |

Primary Examiner—Leo P. Picard
Assistant Examiner—Paramita Ghosh
Attorney, Agent, or Firm—Fishman, Dionne & Cantor

[57] ABSTRACT

A bus bar is presented which sandwiches a high capacitance flexible dielectric sheet material between the conductive layers. The high capacitance dielectric sheet is comprised of a monolayer of multilayer or single layer high dielectric (e.g. ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric (e.g. ceramic) chips together. Next, the opposite planar surfaces of the array (including the polymer) are electroless plated or electroded by vacuum metal deposition, or sputtering, to define opposed metallized surfaces. The whole structure is then sandwiched between two conductive layers. The result is a bus bar with a very low characteristic impedance.

8 Claims, 5 Drawing Sheets

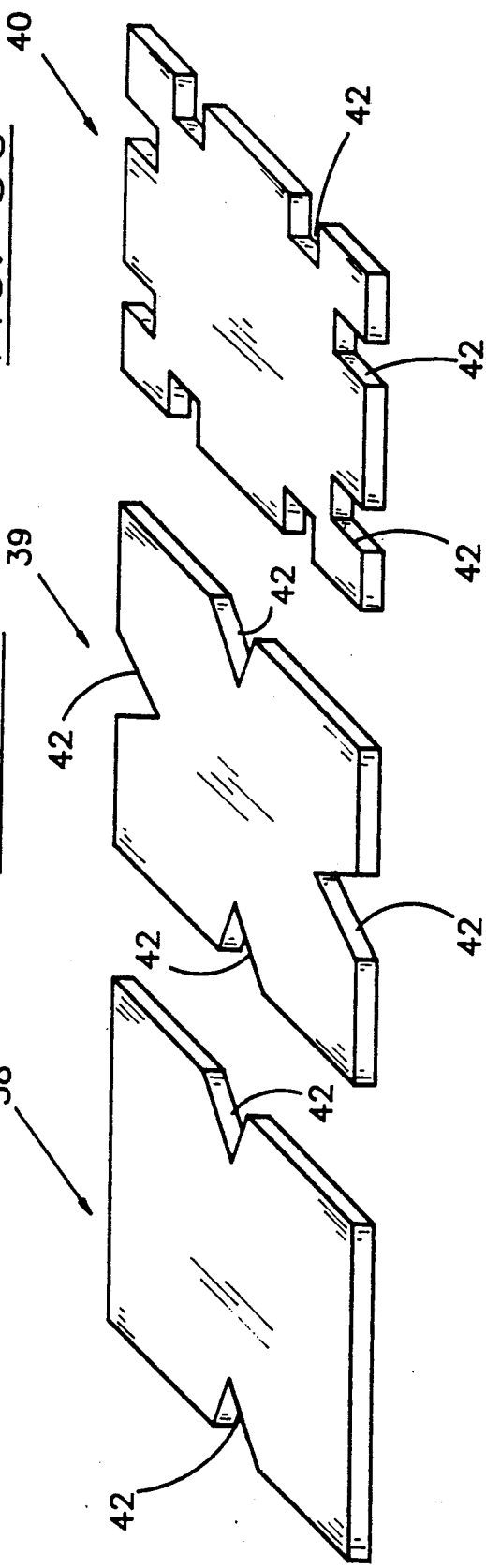

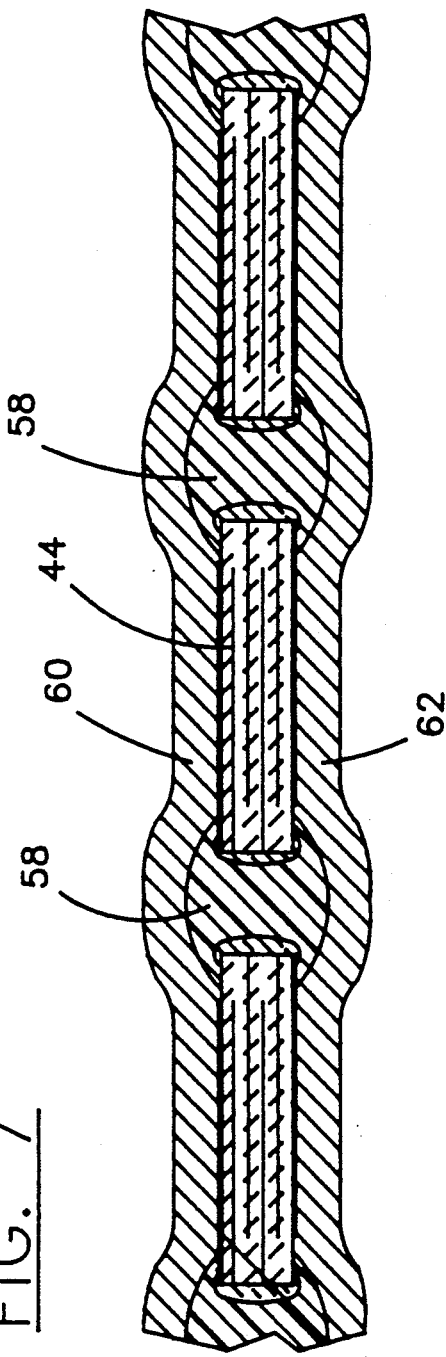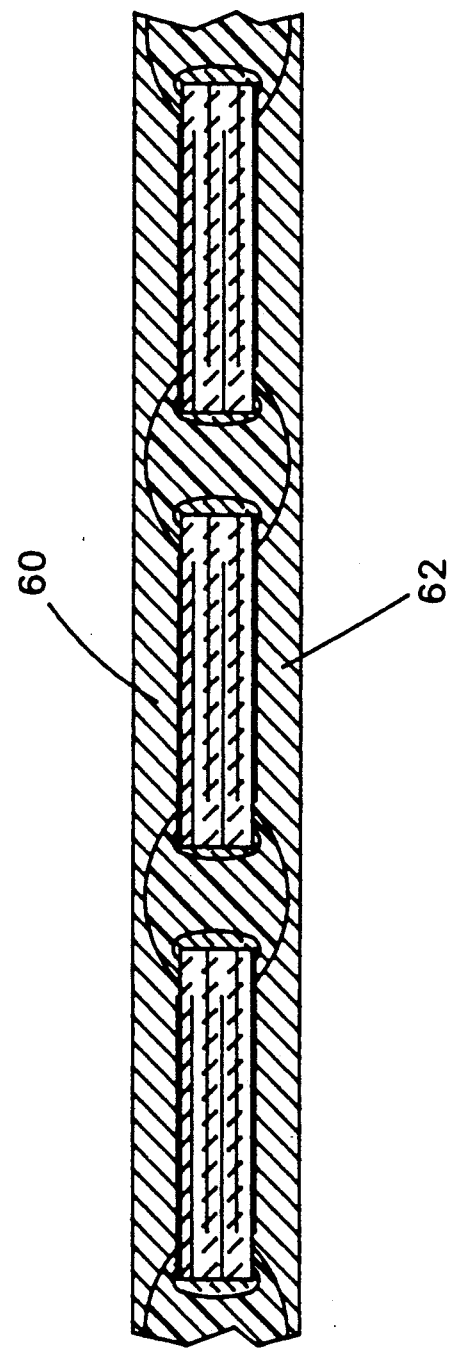

LOW IMPEDANCE BUS BAR

BACKGROUND OF THE INVENTION

This invention relates generally to a bus bar for power distribution. More particularly, this invention relates to a high dielectric constant sheet material sandwiched between two conductive layers which defines a high current laminated bus bar.

It will be appreciated that there is an ever increasing need for a reliable, flexible high dielectric material which may be used for a variety of applications in electronic circuitry design and manufacture. Presently, flexible high dielectric materials of this type are manufactured by mixing small particles (e.g. 1–3 microns) of a high dielectric constant material into a flexible polymeric matrix. Surprisingly, the resultant effective dielectric constant of the dielectric impregnated polymer is relatively low. For example, the dielectric constant of a Z5U $BaTiO_3$ is in the range of 10,000 to 12,000. However, when such Barium Titanate is mixed with a flexible polymer such as polyimide, polyester, polyetherimide and like materials, the effective dielectric constant realizable is only on the order of 20 to 40 (depending on the loading ratio of the dielectric in the polymer).

It will be further appreciated that a need exists for high capacitance and low impedance bus bars. Computer systems that use laminar bus bars for power distribution are becoming faster (higher clock frequencies and shorter switching rise times), which makes the bus bars more prone to distribute switching noise. Unfortunately, such switching noise adversely effects the overall performance of the computer system. Low impedance bus bars reduce the serious problems associated with such switching noise.

SUMMARY OF THE INVENTION

The above-discussed and other problems and deficiencies of the prior art are overcome or alleviated by the high capacitance, low impedance bus bar of the present invention. The bus bar of the present invention comprises a pair of conductive layers incorporating therebetween a high dielectric constant flexible sheet material. In accordance with the present invention, this high capacitance flexible dielectric material is comprised of a monolayer of multilayer or single layer high dielectric constant (e.g. ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric constant (e.g. ceramic) chips together. Next, the opposite planar surfaces of the array (including the polymer) are metallized (e.g. electroless plated or metallized by vacuum deposition, sputtering, etc.) to define opposed metallized surfaces. The end result is a relatively flexible high capacitance dielectric film or sheet material which is drillable, platable, printable, etchable, laminable and reliable.

In a preferred embodiment, the small high dielectric constant chips are cylindrical in shape. However, the chips may be any other suitable shape including rectangular. Also, the high dielectric constant chips may include punches or cut-outs to improve mechanical adhesion between the chips and the polymeric binding material.

Also as mentioned above, rather than using high dielectric constant (ceramic) pellets, the discrete high dielectric monolayer may be comprised of an array of multilayer ceramic chips such as those disclosed at FIGS. 4 and 10 in U.S. Pat. No. 4,748,537 and at FIGS. 11–16 in U.S. Pat. No. 4,706,162, all of which are assigned to the assignee hereof and incorporated herein by reference.

The bus bar of this invention improves power distribution in digital circuits. As mentioned, this bus bar comprises a high capacitance flexible dielectric layer sandwiched between two conductors. This bus bar construction provides very high capacitance per unit length resulting in a characteristic impedance on the order of one hundred times less than prior art bus bars. The low impedance bus bar of the present invention is very effective in preventing the distribution of electrical noise to the circuit which the bus bar serves.

The above discussed and other features and advantages of the present invention will be appreciated and understood by those of ordinary skill in the art from the following detailed description and drawing.

BRIEF DESCRIPTION OF THE DRAWINGS

Referring now to the drawings, wherein like elements are numbered alike in the several FIGURES:

FIGS. 5A, 5B and 5C are perspective views of alternative high dielectric constant pellet configurations which may be used in accordance with the present invention;

FIG. 6 is a cross-sectional elevation view of still another embodiment of the present invention utilizing multilayer capacitive elements;

FIG. 7 is a cross-sectional elevation view similar to FIG. 6, subsequent to metallization; and FIG. 8 is a cross-sectional elevation view similar to FIG. 7, and subsequent to additional metallization.

DESCRIPTION OF THE PREFERRED EMBODIMENT

The present invention relates to a bus bar comprising a pair of conductive layers which sandwich therebetween a high dielectric constant flexible polymeric sheet material.

Figure 1:
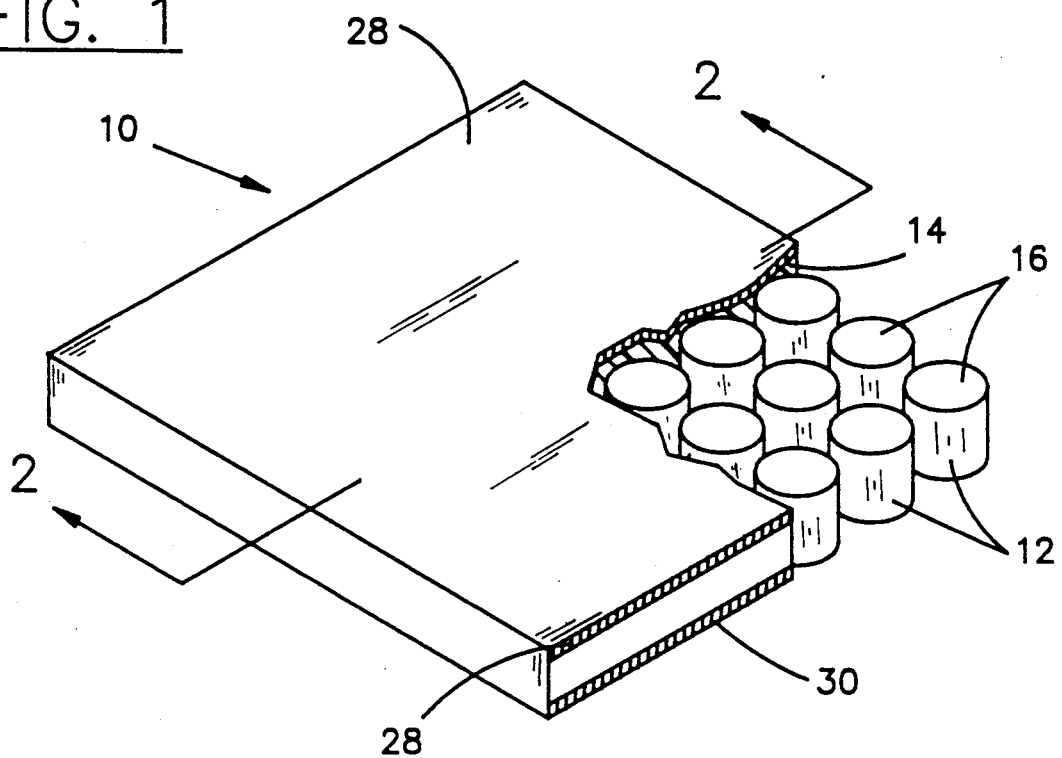
FIG. 1 is a perspective view of the high dielectric flexible sheet material of the present invention.
Figure 2:
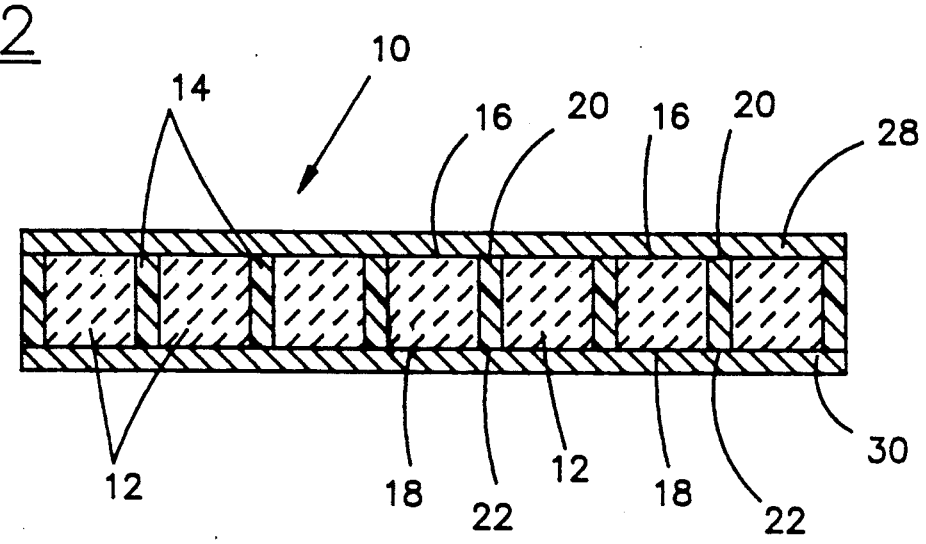
FIG. 2 is a cross-sectional elevation view along the line 2—2 of FIG. 1.

Referring first to FIGS. 1 and 2, the high dielectric constant flexible polymeric sheet material is shown generally at 10. Flexible sheet 10 is comprised of a monolayer of high dielectric constant pellets or chips 12 which are of relatively small area and thickness and are arranged in a planar array. The chips are separated from each other by a small distance to define spaces therebetween. The spaces between the chips 12 are filled with a suitable polymeric material 14. Polymeric material 14 will act as a binder to hold the array of high dielectric constant pellets 12 together. Significantly, polymeric material 14 will contact only the sides of pellets 12 and will be out of contact with the top and bottom surfaces 16 and 18 of each pellet 12. This will result in both end surfaces 16, 18 of high dielectric constant pellets 12 and end surfaces 20, 22 of polymeric binder 14 being exposed. Next, these opposed and exposed surfaces (comprised of surfaces 16 and 20 on the one hand and surfaces 18 and 22 on the other hand) of the pellet array and polymer are metallized to define a thin (e.g. about 10–50 micro inches) metallized layer 24 and 26. These thin metallized layers 24 and 26 may then be plated up to higher thicknesses (e.g. about 1–2 mils) by well known electroplating techniques to define layers 28 and 30. The thin metallized layers may be produced using any known method including by electroless plating or by vapor deposition techniques including vacuum deposition, sputtering, etc.

The material used to produce high dielectric constant pellets 12 may be any suitable high dielectric constant material and is preferably a high dielectric constant ceramic material such as $BaTiO_3$. In addition, other known high dielectric ceramic materials may be utilized including lead magnesium niobate, iron tungsten niobate, etc. It will be appreciated that by "high" dielectric constant, it is meant dielectric constants of over about 10,000. As mentioned, the pellets are relatively small and are preferably cylindrical in shape having a height of 0.015" and a diameter of 0.020". If a ceramic is used, the pellets should be fully sintered prior to being bonded together by the polymer.

Of course, while cylindrical configurations for the array of pellets 12 are preferred, any other suitably shaped high dielectric constant pellet may be used. For example, in FIG. 3, a flexible high capacitance sheet is shown at 32 incorporating an array of rectangularly shaped pellets 34 in a polymer matrix 36. Also, in FIGS. 5A–5C, square shaped pellets are shown at 38, 39 and 40 respectively which are provided with from two through eight slots or grooves 42. It will be appreciated that these grooves or slots will provide a stronger mechanical bond between the polymeric binder and the pellet.

The pellet array is impregnated with a suitable polymer which may be a either a flexible thermoplastic or a flexibilized thermoset (epoxy, polyetherimide, polyester, etc.) to give the array mechanical strength and electrical insulating stability with temperature, moisture, solvents, etc. The polymeric material should be a high temperature (approximately 350° F.) polymer which is somewhat flexible and has a dielectric constant of between about 4–9. Preferred materials include polyetherimides, polyimides, polyesters and epoxies. It will be appreciated that the flexibility is necessary to preclude cracking of the sheet under stress.

Preferably, the dielectric sheet is electroless plated with copper or nickel.

The resultant sheet material will have an effective high dielectric constant of better than 1,000, a small thickness (approximately 0.005"–0.015"), will be flexible, will be metallized on both sides and will be drillable and platable.

EXAMPLES

A mathematical analysis can be made to determine the effective dielectric constant of the combined pellet array and polymeric matrix.

EXAMPLE 1

For example, using a dielectric sheet as depicted in FIGS. 1 and 2 which incorporates cylindrical pellets measuring 0.020" in diameter by 0.010" in length; and assuming a sheet of one square inch having a total of about 2,500 cylinders.

Capacitance of the dielectric sheet is determined using the following formula:

$$C = \epsilon \times (\epsilon_o) \times (a/D) \times (N) \qquad (1)$$

where
C = total capacitance
$\epsilon$ = relative permitivity of the dielectric
$\epsilon_o$ = permitivity of free space
a = area of electroded part of dielectric
D = distance between two electrodes of dielectric
N = number of dielectric pellets Assuming that the pellets are made of a Z5U dielectric with a dielectric constant of 15,000, then the capacitance of such an array would be:
$\epsilon = 15,000$
$\epsilon_o = 8.85 \times 10^{-12}$
$a = 2.827 \times 10^{-7} m^2$
$D = 3 \times a0^{-4} m$
$N = 2500$
Thus:

$$C = 15,000 \times 8.85 \times 10^{-12} \times \frac{2.827 \times 10^{-7}}{3 \times 10^{-4}} \times 2500$$

or $$C = 312 \text{ nF/sq.-in. or } 312,500 \text{ pF/sq. in.}$$

If an X7R dielectric (with a dielectric constant of 4500) is utilized, then using the above equation (1), the capacitance per square inch would be about 93.6 nF/sq. in.

EXAMPLE 2

Figure 3:
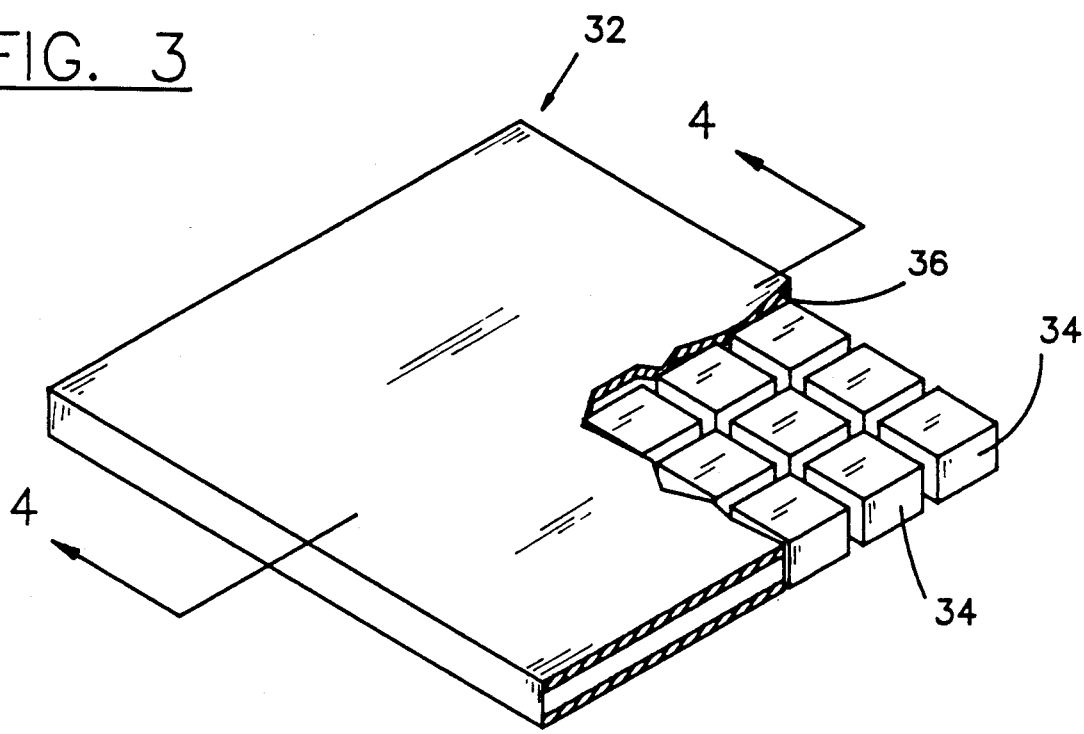
FIG. 3 is a perspective view, similar to FIG. 1, of a different embodiment of the present invention.
Figure 4:
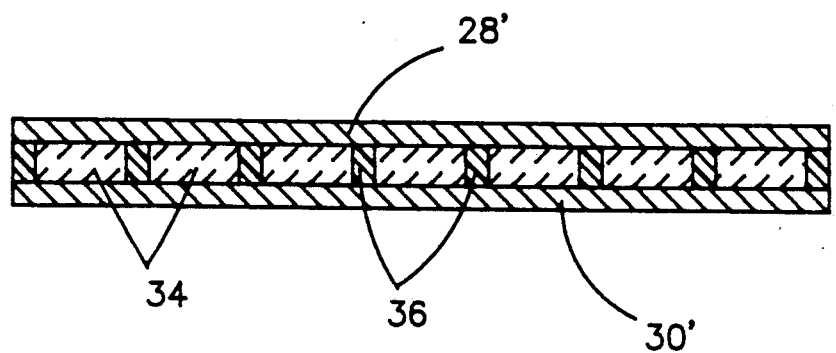
FIG. 4 is a cross-sectional elevation view along the line 4—4 of FIG. 3.

If a rectangular ceramic pellet (such as shown in FIG. 3) made from lead magnesium niobate (having a dielectric constant of 17,000) is selected with each pellet having surface area dimensions of 0.20"×0.30" and 0.015" in thickness; and with the array of pellets being spaced apart 0.020", then, using the same calculations as in Example 1, the capacitance will be 224 nF/sq. in.. Alternately, if an internal boundary layer dielectric is selected with a dielectric constant of approximately 60,000 [such as $Sr_{0.4} Ba_{0.6}) TiO_3 + 10H_2O$] then the effective capacitance per square inch will be equal to 759 n F./sq. in.

Still another embodiment of the present invention is shown in FIGS. 6–8. In this embodiment, rather than using high dielectric constant pellets of homogeneous composition, a multilayer capacitive element 44 is utilized. Capacitive element 44 is a known multilayer ceramic chip capacitor (such as disclosed in aforementioned U.S. Pat. Nos. 4,745,537 and 4,706,162) comprised of a plurality of metallized layers 46 with alternating layers being connected to end electrodes 48 and 50. The top and bottom surfaces of multilayer chip 44 includes exposed electrodes 52 and 54 which are also connected to opposed end electrodes 48 and 50, respectively. Finally, an insulating cap 56 is provided on each end electrode 48 and 50 to prevent shorting between an exposed top or bottom electrode 52, 54 and one of the end electrodes 48 and 50. As in the previously discussed embodiments of FIGS. 1–4, in this latter embodiment, a plurality of multilayer capacitive elements 44 are arranged in a monolayer array and a suitable polymeric adhesive 58 is used to bind the side edges of the multilayer chips 44 together. As shown in FIG. 6, this will typically result in an undulating surface between the polymer 58 and each multilayer capacitive element 44. As shown in FIG. 7, the array can then be electroless plated with copper, nickel, tin or any other suitable plating material to define thin metallized outer layers 60 and 62. Of course the undulating surface features may be eliminated by sufficiently building up the thickness of the plated electrodes and then grinding or lapping them to define a planar outer surface as in FIG. 8.

It will be appreciated that the capacitance per unit area for the FIGS. 6–8 embodiment of the present invention will depend upon the size of the chips, the number of the chips per unit area, the capacitance of individual chips and the thickness of the chips.

EXAMPLE 3

As an illustration of the levels of capacitance achievable with the embodiment of FIGS. 6–8, a flexible sheet of the type shown in FIG. 8 using multilayer capacitive elements 44 having length dimensions of 0.35", width dimensions of 0.20" and thickness dimensions of 0.018" will be discussed. The dielectric used in the capacitive element is a lead magnesium niobate dielectric wherein capacitance on an average of 1.0 micro F/chip is obtainable. Next, assuming a 0.030" gap between chips in the chip array, there would be 4.4 chips in the y direction and 3.03 chips in the x direction for a total of 13.33 chips per square inch or a total capacitance of 13.33 micro F./sq. in. This is compared to the far lower capacitance obtained from using the embodiment of FIG. 1 (see Example 1) of 0.312 micro F./sq. in.

Figure 9:
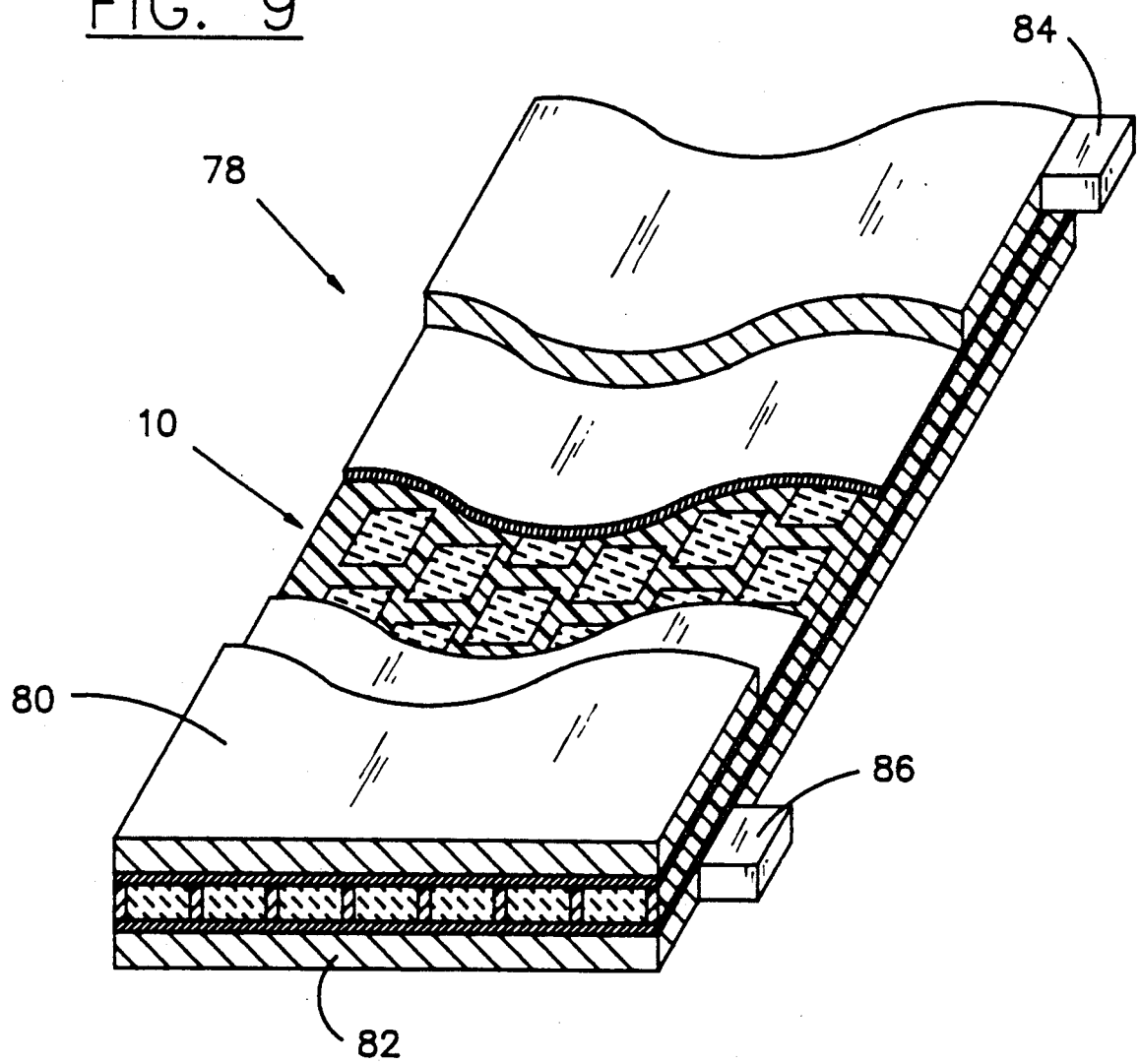
FIG. 9 is a front perspective view of a bus bar which uses as its capacitance layer the high dielectric flexible sheet material of FIG. 1.

Referring now to FIG. 9 the bus bar of the present invention is shown generally at 78. Bus bar 78 is comprised of two conductive layers 80 and 82 sandwiching therebetween high capacitance flexible dielectric layer 10. Each conductive layer 80 and 82 includes a plurality of tabs 84 and 86, respectively, extending outwardly therefrom. Conductive layers 80 and 82 may be attached to flexible dielectric layer 10 using any known method such as solder or a suitable conductive adhesive. High capacitance layer 10 has already been described in detail above and may be composed of any of the components shown in FIGS. 1–8. Tabs 84 and 86 extend from conductive layers 80 and 82 and provide a connection with external circuit components. Conductive layers 80 and 82 can be made of copper, or any other conductive material.

Prior art laminated bus bars are typically comprised of a pair of conductors which sandwich a layer of insulating material. Capacitance values are improved by inserting discrete ceramic capacitors as disclosed in, for example, U.S. Pat. No. 4,436,953. Significantly, the bus bar of the present invention is greater than one hundred times more effective (relative to the prior art) in preventing the distribution of electrical noise generated by switching loads or circuits which the bus bar serves. For example, typical capacitances per square inch (with a Z5U dielectric) are in the range of 150 to 260 nF. Assuming 200 nF per square inch, then the inductance and capacitance per unit length of the bus bar are $L=0.00012$ H/cm and $C=0.197$ F/cm. Thus, the characteristic impedance $Z_o$ would be about 0.024 OHM compared to a typical prior art bus bar of equivalent dimensions which has a characteristic impedance of 3.3. OHM. In other words the bus bar of the present invention has an impedance which is about 134 times lower than the prior art bus bar.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A bus bar comprising:
an array of spaced high dielectric chips arranged in a single layer, each of said chips having side, top and bottom surfaces and each chip having a dielectric constant of at least 10,000;
a flexible polymeric binder between said side surfaces of said chips and binding said chips to define a cohesive sheet having opposed first and second planar surfaces with said top and bottom surfaces of said chips being exposed on said respective first and second surfaces, said binder being selected from the group consisting of flexible thermoplastic polymers and flexibilized thermoset polymers;
a first metallized layer on said first planar surface;
a second metallized layer on said second planar surface;
a first conductive layer having at least one first conductive tab extending therefrom, said first conductive layer being electrically and mechanically connected to said first metallized layer; and
a second conductive layer having at least one second conductive tab extending therefrom, said second conductive layer being electrically and mechanically connected to said second metallized layer.

2. The bus bar of claim 1 wherein:
said chips comprise a sintered ceramic material.

3. The bus bar of claim 2 wherein:
said ceramic material is selected from the group consisting of barium titanate, lead magnesium niobate or iron tungsten niobate.

4. The bus bar of claim 1 wherein:
said chips have a shape which is selected from the group consisting of cylindrical, rectangular or square.

5. The bus bar of claim 1 including:
at least one groove formed in said chips to enhance mechanical binding with said polymeric binder.

6. The bus bar of claim 1 wherein:
said chips comprise multilayer capacitive elements having exposed top and bottom electrodes which electrically contact respective of said first and second metallized layers.

7. The bus bar of claim 1 wherein:
said first and second metallized layers are comprised of a material selected from the group consisting of copper, nickel or tin.

8. The bus bar of claim 1 wherein:
said first and second conductive layers are connected to said respective first and second metallized layers with solder or conductive adhesive.

* * * * *